(12) United States Patent
Miks et al.

(10) Patent No.: US 6,900,527 B1
(45) Date of Patent: May 31, 2005

(54) LEAD-FRAME METHOD AND ASSEMBLY FOR INTERCONNECTING CIRCUITS WITHIN A CIRCUIT MODULE

(75) Inventors: Jeffrey Alan Miks, Chandler, AZ (US); Kenneth Kaskoun, Phoenix, AZ (US); Markus Liebhard, Chandler, AZ (US); Donald Craig Foster, Mesa, AZ (US); Paul Robert Hoffman, Chandler, AZ (US); Frederic Bertholio, Ornex (FR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/956,190

(22) Filed: Sep. 19, 2001

(51) Int. Cl.[7] .......................... H01L 23/02; H01L 23/04
(52) U.S. Cl. ........................................ 257/679; 257/698
(58) Field of Search ................................ 257/666–670, 257/672–676, 678, 679, 698; 438/106; 361/728, 730, 813

(56) References Cited

U.S. PATENT DOCUMENTS

| 3,668,299 A | * | 6/1972 | McNeal ..................... 174/52.2 |
| 4,532,419 A | | 7/1985 | Takeda |
| 4,905,124 A | | 2/1990 | Banjo et al. |
| 4,974,120 A | | 11/1990 | Kodai et al. |
| 5,360,992 A | * | 11/1994 | Lowrey et al. ............. 257/666 |
| 5,459,350 A | * | 10/1995 | Date et al. .................. 257/666 |
| 5,574,309 A | | 11/1996 | Papapietro et al. |
| 5,742,479 A | | 4/1998 | Asakura |
| 5,784,259 A | | 7/1998 | Asakura |
| 5,792,676 A | * | 8/1998 | Masumoto .................. 438/111 |
| 5,822,190 A | | 10/1998 | Iwasaki |
| 5,864,173 A | * | 1/1999 | Fogelson ..................... 257/666 |
| 5,994,768 A | * | 11/1999 | Fogelson ..................... 257/666 |
| 5,998,856 A | * | 12/1999 | Noda et al. .................. 257/666 |
| 6,002,166 A | * | 12/1999 | Noda et al. .................. 257/666 |
| 6,040,622 A | | 3/2000 | Wallace |
| 6,081,029 A | * | 6/2000 | Yamaguchi .................. 257/718 |
| 6,130,473 A | * | 10/2000 | Mostafazadeh et al. ..... 257/666 |
| D445,096 S | | 7/2001 | Wallace |
| D446,525 S | | 8/2001 | Okamoto et al. |
| 6,329,715 B1 | * | 12/2001 | Hayashi ....................... 257/724 |
| 6,333,549 B2 | * | 12/2001 | Drehobl et al. ............. 257/666 |
| 6,396,130 B1 | * | 5/2002 | Crowley et al. ............. 257/666 |
| 6,420,780 B1 | * | 7/2002 | Ko ............................... 257/666 |
| 6,424,024 B1 | * | 7/2002 | Shih et al. ................... 257/667 |
| 6,603,196 B2 | * | 8/2003 | Lee et al. .................... 257/676 |
| 6,624,005 B1 | | 9/2003 | DiCaprio et al. |
| 2002/0140068 A1 | | 10/2002 | Lee |

FOREIGN PATENT DOCUMENTS

| JP | 3-112688 | | 5/1991 | |
| JP | 6-236959 | * | 8/1994 | ................. 257/666 |
| JP | 07017175 A | | 1/1995 | |
| JP | 08190615 A | | 7/1996 | |
| JP | 10-12646 | | 1/1998 | |
| JP | 10-334205 | | 12/1998 | |
| JP | 11-45959 | | 2/1999 | |

* cited by examiner

*Primary Examiner*—Evan Pert
(74) *Attorney, Agent, or Firm*—Stetina Brunda Garred & Brucker

(57) ABSTRACT

A lead-frame method and assembly for interconnecting circuits within a circuit module allows a circuit module to be fabricated without a circuit board substrate. Integrated circuit dies are attached to a metal lead-frame assembly and the die interconnects are wire-bonded to interconnect points on the lead-frame assembly. An extension of the lead-frame assembly out of the circuit interconnect plane provides external electrical contacts for connection of the circuit module to a socket.

19 Claims, 3 Drawing Sheets

US 6,900,527 B1

LEAD-FRAME METHOD AND ASSEMBLY FOR INTERCONNECTING CIRCUITS WITHIN A CIRCUIT MODULE

FIELD OF THE INVENTION

The present invention relates generally to circuit modules, and more specifically, to a method and assembly for interconnecting circuits within a circuit module.

BACKGROUND OF THE INVENTION

Circuit modules or cards are increasing in use to provide storage and other electronic functions for devices such as digital cameras, personal computing devices and personal digital assistants (PDAs). New uses for circuit modules include multimedia cards and secure digital cards.

Typically, circuit modules contain multiple integrated circuit devices or "dies". The dies are interconnected using a circuit board substrate, which adds to the weight, thickness and complexity of the module. Circuit modules also have electrical contacts for providing an external interface to the insertion point or socket, and these electrical contacts are typically circuit areas on the backside of the circuit board substrate, and the connection to the dies are provided through vias through the circuit board substrate. Producing vias in the substrate adds several process steps to the fabrication of the circuit board substrate, with consequent additional costs.

Therefore, it would be desirable to provide a method and assembly for interconnecting circuits within modules that require no circuit board substrate.

SUMMARY OF THE INVENTION

A circuit module assembly and method for interconnecting circuits within modules to provide a circuit module that may be fabricated without a circuit board substrate. A lead-frame assembly is connected to one or more dies and external contacts may be provided by an extension of the lead-frame assembly out of the plane of the die interconnect.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
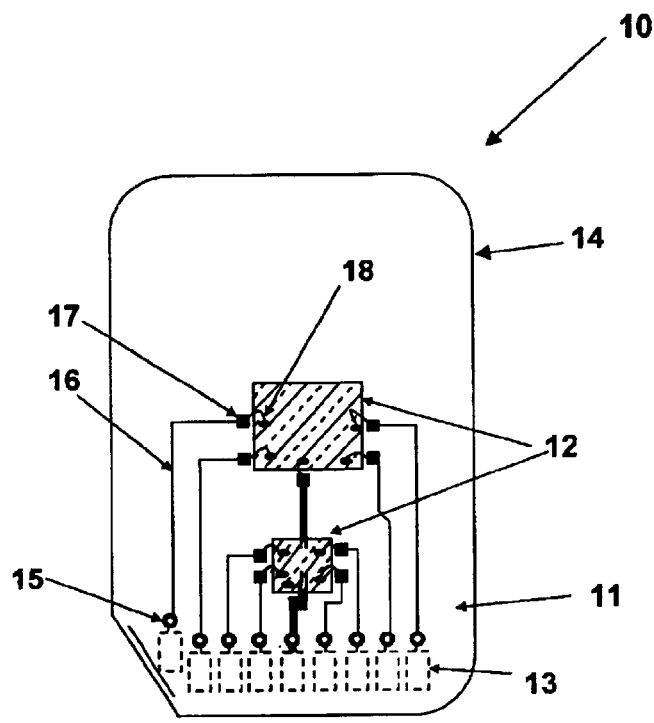
FIG. 1A is a pictorial diagram depicting a top view and FIG. 1B is a pictorial diagram depicting a cross section of a prior art circuit module.

Referring now to the figures and in particular to FIG. 1A a top view of a prior art circuit module 10 is depicted. Circuit module 10 is depicted as a circuit module as used in various multimedia card memory applications. The present invention is also applicable to cards and modules having other outlines such as secure digital cards and to peripheral device cards (I/O cards), as well.

A carrier 14 to which integrated circuit dies 12 are attached and circuit contacts 13 are included on the bottom side, is covered by a cover 11 that is bonded to carrier 14. The circuit module housing may be completely formed from an encapsulant, or the circuit may be encapsulated and a lid 19 applied over the encapsulant. Dies 12 are coupled to each other and to circuit contacts 13 by circuit traces 16, which are typically etched from a metal layer on the top of carrier 14. Circuit contacts 13 are coupled by means of plated-through holes 15 that pass through carrier 14. The bottom side of carrier 14 is also typically etched from a metal layer on the bottom side forming electrical contacts 13 that are generally plated with a corrosion resistant material such as gold and circuit contacts 13 connect on the bottom side of carrier 14 to plated through holes 15 by circuit traces on the bottom side of carrier 14. Circuit traces 16 include wire bonding areas 17 that may also be plated, permitting a wire bonding apparatus to electically couple dies 12 by wires 18.

Figure 1B:
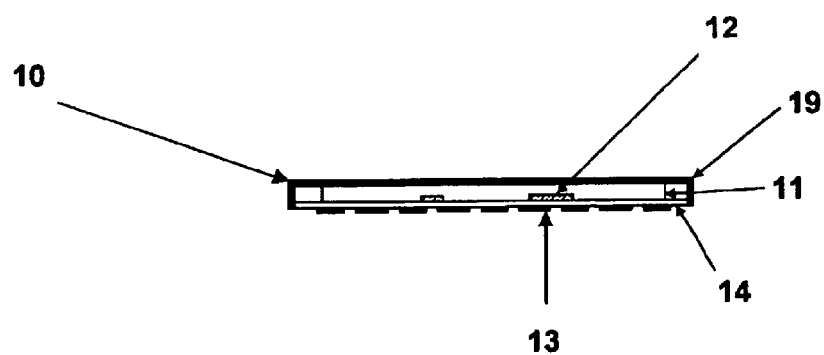

Referring now to FIG. 1B, a cross section end view of circuit module 10 is depicted. Dies 12 are covered by cover 11 and are bonded to carrier 14. Circuit contacts 13 are disposed on the bottom side of carrier 14 to provide electrical connections to the external circuits via a socket in which circuit module 10 is inserted.

The present invention provides a circuit module that does not require a separate carrier, wherein the circuit paths between dies 12 and electrical contacts 13 are provided by a conductive lead-frame to which dies 12 are bonded and an encapsulant applied surrounding the lead-frame to provide support and electrical insulation.

Figure 2A:
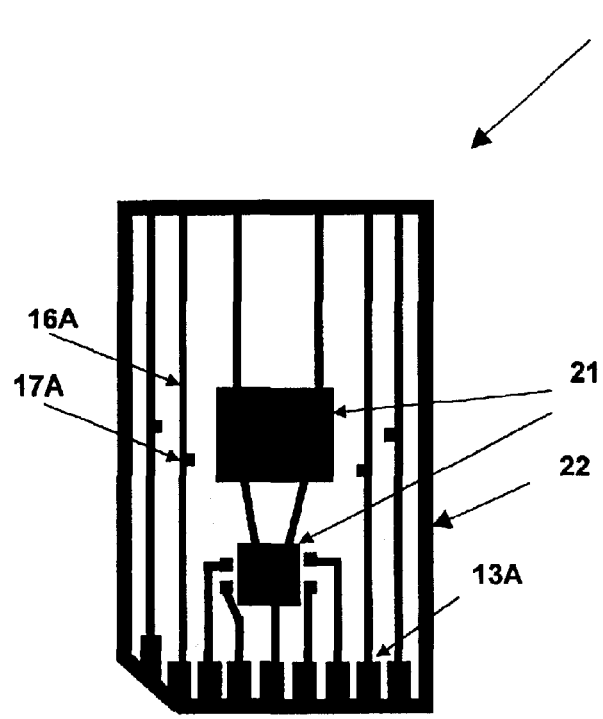
FIG. 2A is a pictorial diagram depicting a top view and FIG. 2B is a pictorial diagram depicting a cross section of a lead-frame in accordance with an embodiment of the invention.

Referring now to FIG. 2A, a top view of a lead-frame 20 in accordance with an embodiment of the invention is depicted. Circuit traces 16A are supported by a dam bar 22 that surrounds the periphery of the lead-frame, providing rigidity during the fabrication and integration processes. Lead-frame 20 is generally stamped from a metal, such as copper, and integrated circuit dies are bonded to lead-frame in die bonding areas 21. Wire bonding pads 17A are provided on circuit traces 16A to permit attachment of wires from dies to the lead-frame. The lead-frame is then encapsulated and portions of dam bar 22 are cut, resulting in electrical isolation of circuit traces 16A, after mechanical rigidity has been provided by the encapsulant.

In addition or in alternative to wire bonding pads 17A, pads may be included for attachment of surface mounted passive components by soldering or conductive adhesive attachment, and pad grids may be included for attachment of pre-packaged integrated circuits.

Figure 2B:
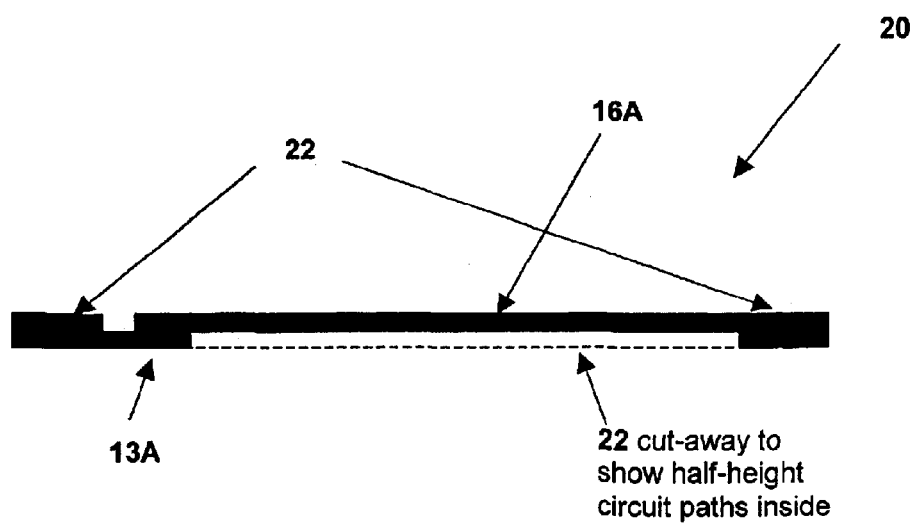

Referring now to FIG. 2B, a cross-section side view of lead-frame 20 is depicted. Dam bar 22 is shown at ends of the lead-frame and is cut-away along the sides in the figure to illustrate that circuit traces 17A are a half-thickness of metal with respect to dam bar 22. This half-thickness may be produced by etching the bottom side of lead-frame after applying an etchant resistant coating to dam bar and circuit contacts 13A. Circuit contacts 13A are also partially a half-thickness of metal, produced by etching the top side of lead-frame after applying an etchant resistive coating to circuit traces 16A and dam bar 22. The etching of both sides of lead-frame 20 results in a circuit that has circuit contacts 13A disposed as an extension out of the plane of circuit traces 16A, while the full thickness portion of the electrical contacts/circuit trace combination produces a continuous conductive and mechanically rigid connection from circuit traces 16A to circuit contacts 13A. Thus, encapsulant may be applied beneath circuit traces and the circuit contact 13A surfaces may protrude from the encapsulant, providing an interface connection external to a circuit module.

As an alternative, circuit contacts 13A may be fabricated is in the same plane as circuit traces 16A and additional length supplied so that the circuit traces may be bent to provide an extension out of the plane of circuit traces 16A so that circuit contacts 13A may protrude from an encapsulant applied beneath lead-frame 20.

The illustrative embodiments herein depict an etched lead-frame, but lead-frames may also be stamped in accordance with an embodiment of the present invention. The alternative embodiment depicted, wherein circuit traces are bent to provide circuit contacts especially lends itself to stamping, because the circuit traces may be formed and bent in a single stamping operation.

Figure 3A:
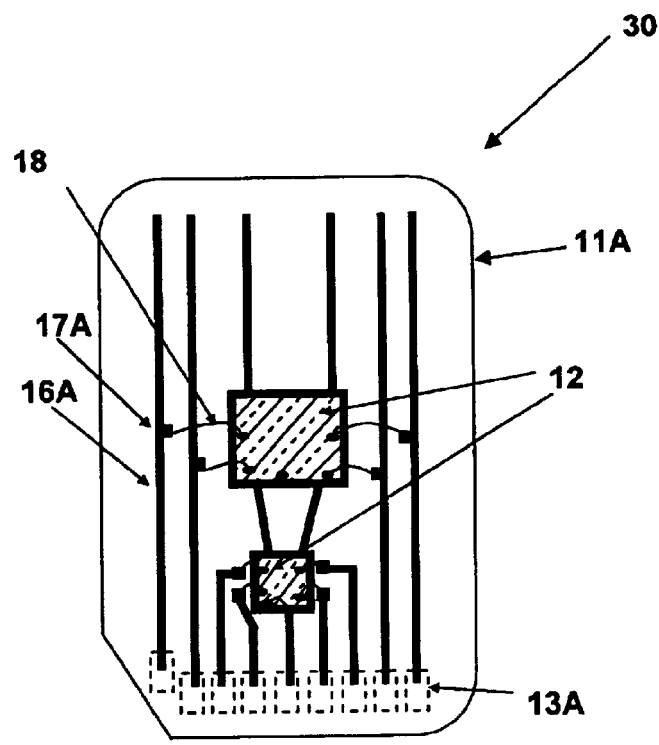
FIG. 3A is a pictorial diagram depicting a top view and FIG. 3B is a pictorial diagram depicting a cross section of a circuit module in accordance with an embodiment of the invention.

Referring now to FIG. 3A, a top view of a circuit module 30, in accordance with an embodiment of the invention is depicted. The depiction shows the internal features after dies 12 have been bonded to lead-frame 20, an encapsulant cover 11A applied and the dam bar 22 is singulated from circuit module 30. The resulting circuit module 30 has circuit traces 16A that are isolated (but supported by the encapsulant) and wires 18 have been bonded from dies 12 to bonding pads 17A. Circuit contacts 13A are located at the bottom surface of encapsulant cover 11A and protrude from or are conformal to the bottom surface to provide an external electrical connection.

Figure 3B:
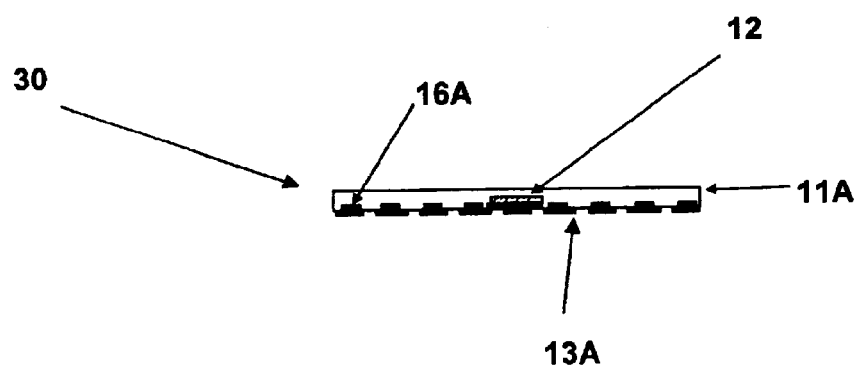

Referring now to FIG. 3B, a cross-section end view of a circuit module 30, in accordance with an embodiment of the invention is depicted. The plane of circuit traces 16A adjacent to the plane of electrical contacts 13A may be seen from the figure. Die 12 is shown as mounted above the plane of circuit traces 16A, but a mounting within the plane of circuit traces is also possible. Additionally, circuit contacts 13A may be attached using plating techniques to attach to circuit traces 16A rather than including the circuit contacts within the lead-frame.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A multimedia card, comprising:
   at least one integrated circuit for providing an electronic function of the multimedia card and having an integrated circuit bottom surface and an integrated circuit top surface;
   a lead-frame carrier for mounting and providing electrical connection to the at least one integrated circuit within the circuit module and having a lead-frame carrier bottom surface and a lead-frame carrier top surface;
   an encapsulation containing the at least one integrated circuit and the lead-frame carrier, the encapsulation having an encapsulation bottom surface extending below both the integrated circuit bottom surface and the lead-frame carrier bottom surface and an encapsulation top surface extending above the integrated circuit top surface; and
   a plurality of external contacts forming a connector for electrical interface to an external device via contact with the contacts and electrically coupled to the lead-frame carrier and exposed on the encapsulation bottom surface for providing an electrical interface to the at least one integrated circuit.

2. The multimedia card of claim 1, wherein the at least one integrated circuit is a plurality of integrated circuits, and wherein the lead-frame carrier comprises a plurality of conductors providing electrical connections between the plurality of integrated circuits.

3. The multimedia card of claim 1, wherein the plurality of external contacts are integral to the lead-frame carrier.

4. The multimedia card of claim 3, wherein the lead-frame carrier further comprises an extension extending from the lead-frame carrier to form the external contacts.

5. The multimedia card of claim 3, wherein the electrical interface between the lead-frame carrier and the plurality of external contacts is provided by a region of each of the contacts which is thicker than a portion of the lead-frame carrier connecting to the at least one integrated circuit.

6. The multimedia card of claim 1, wherein the at least one integrated circuit is affixed to the lead-frame carrier with an adhesive.

7. A multimedia card, comprising:
   a plurality of integrated circuits for providing an electronic function of the multimedia card;
   a lead frame carrier for mounting and providing electrical connection to the plurality of integrated circuits within the multimedia card wherein the lead frame carrier has a plurality of conductors disposed around the lead frame carrier for providing electrical connections between the plurality of integrated circuits;
   means for containing the at least one integrated circuit and the lead frame carrier on both a top and a bottom side; and
   means electrically coupled and integral to the lead frame carrier for providing an electrical interface to the plurality of integrated circuits.

8. The multimedia card of claim 7, wherein the lead frame carrier comprises an extension extending from the lead frame carrier to form contacts.

9. The multimedia card of claim 7, wherein the means electrically coupled and integral to the lead frame carrier are contiguous with the lead frame carrier.

10. The multimedia card of claim 7, wherein the means electrically coupled and integral to the lead frame carrier are contiguous with the lead frame carrier, and wherein the electrical interface between the lead frame carrier and the means electrically coupled and integral to the lead frame carrier is provided by a region of the means electrically coupled and integral to the lead frame carrier which is thicker than a portion of the lead frame carrier connecting to the integrated circuits.

11. The multimedia card of claim 7, wherein the means electrically coupled and integral to the lead frame carrier are a plurality of external contacts.

12. A circuit module comprising:
   a lead-fame having:
      at least one die bonding area;
      a plurality of contacts; and
      a plurality of traces extending from respective ones of the contacts toward the die bonding area;
   at least one semiconductor die attached to the die bonding area and electrically connected to at least one of the traces; and
   an encapsulant cover at least partially encapsulating the lead-frame and the semiconductor die such that the contacts are exposed in a bottom surface defined by the encapsulant cover.

13. The circuit module of claim 12 wherein:

each of the contacts defines a generally planar bottom surface;

each of the traces defines a generally planar bottom surface;

the bottom surfaces of the contacts and the traces extend along respective ones of a spaced, generally parallel pair of planes; and the bottom surfaces of the contacts are exposed in and substantially flush with the bottom surface of the body.

14. The circuit module of claim 13 wherein each of the contacts defines a top surface having a portion which extends in generally co-planar relation to the bottom surfaces of the traces.

15. The circuit module of claim 14 wherein each of the traces further defines a generally planar top surface, and a portion of the top surface of each of the contacts extends in generally co-planar relation to the top surfaces of the traces.

16. The circuit module of claim 12 wherein the lead-frame has a plurality of die bonding areas, each of which has at least one semiconductor die attached thereto.

17. A circuit module comprising:

a lead-frame having:

a dam bar;

at least one die bonding area disposed within and attached to the dam bar;

a plurality of contacts disposed within and attached to the dam bar; and a plurality of traces extending within the dam bar from respective ones of the contacts toward the die bonding area;

at least one semiconductor die attached to the die bonding area and electrically connected to at least one of the traces; and an encapsulant cover at least partially encapsulating the lead-frame and the semiconductor die such that the contacts are exposed in a bottom surface defined by the encapsulant cover.

18. A secure digital card, comprising:

at least one integrated circuit for providing an electronic function of the secure digital card and having an integrated circuit bottom surface and an integrated circuit top surface;

a lead-frame carrier for mounting and providing electrical connection to the at least one integrated circuit within the circuit module and having a lead-frame carrier bottom surface and a lead-frame carrier top surface;

an encapsulation containing the at least one integrated circuit and the lead-frame carrier, the encapsulation having an encapsulation bottom surface extending below both the integrated circuit bottom surface and the lead-frame carrier bottom surface and an encapsulation top surface extending above the integrated circuit top surface; and a plurality of external contacts forming a connector for electrical interface to an external device via contact with the contacts and electrically coupled to the lead-frame carrier and exposed on the encapsulation bottom surface for providing an electrical interface to the at least one integrated circuit.

19. A compact flash memory card, comprising:

at least one integrated circuit for providing an electronic function of the compact flash memory card and having an integrated circuit bottom surface and an integrated circuit top surface;

a lead-frame carrier for mounting and providing electrical connection to the at least one integrated circuit within the circuit module and having a lead-frame carrier bottom surface and a lead-frame carrier top surface;

an encapsulation containing the at least one integrated circuit and the lead-frame carrier, the encapsulation having an encapsulation bottom surface extending below both the integrated circuit bottom surface and the lead-frame carrier bottom surface and an encapsulation top surface extending above the integrated circuit top surface; and a plurality of external contacts forming a connector for electrical interface to an external device via contact with the contacts and electrically coupled to the lead-frame carrier and exposed on the encapsulation bottom surface for providing an electrical interface to the at least one integrated circuit.

* * * * *